United States Patent [19]

Kawamura et al.

[11] Patent Number: 5,787,191
[45] Date of Patent: Jul. 28, 1998

[54] WIRING PATTERN INSPECTION APPARATUS FOR PRINTED CIRCUIT BOARD

[75] Inventors: Hideaki Kawamura, Sagamihara; Atsuharu Yamamoto, Kawasaki; Yuji Maruyama; Hidehiko Kawakami, both of Tokyo; Katsuhiro Kondoh, Osaka; Iwao Ichikawa, Nishinomiya, all of Japan

[73] Assignee: Matsushita Electric Industrial Co., Ltd., Osaka, Japan

[21] Appl. No.: 467,442

[22] Filed: Jun. 6, 1995

Related U.S. Application Data

[62] Division of Ser. No. 219,759, Mar. 29, 1994, Pat. No. 5,459,795, which is a continuation of Ser. No. 829,199, Feb. 3, 1992, abandoned.

[30] Foreign Application Priority Data

Feb. 26, 1991 [JP] Japan ................................. 3-30580
Oct. 15, 1991 [JP] Japan ................................. 3-265890

[51] Int. Cl.$^6$ ........................ G06K 9/36; G06K 9/40; G06K 9/00
[52] U.S. Cl. ........................ 382/149; 382/256; 382/257
[58] Field of Search ........................ 382/149, 256, 382/257

[56] References Cited

U.S. PATENT DOCUMENTS

| | | | |
|---|---|---|---|
| 4,644,585 | 2/1987 | Crimmins et al. | 382/257 |
| 4,692,943 | 9/1987 | Pietzsch et al. | 358/106 |
| 4,853,967 | 8/1989 | Mandeville . | |
| 4,855,933 | 8/1989 | Kondo | 382/55 |
| 4,975,972 | 12/1990 | Bose et al. | 382/8 |
| 5,062,142 | 10/1991 | Meckley | 382/27 |
| 5,115,475 | 5/1992 | Lebeav | 358/106 |
| 5,202,933 | 4/1993 | Bloomberg | 352/27 |
| 5,214,712 | 5/1993 | Yamamoto et al. | 382/149 |
| 5,311,598 | 5/1994 | Bose et al. | 382/149 |
| 5,619,592 | 4/1997 | Bloomberg et al. | 382/257 |

OTHER PUBLICATIONS

"Machine-vision Techniques for Inspection of Printed Wiring Boards and Thick-film Circuits" by J.L.C. Sanz et al, J. Opt. Amer., vol. 3, No. 9, pp. 1465-1482, Sep. 1986.

"Novel Method for Analysis of Printed Circuit Images" by J.R. Mandeville, IBM J. Res. Develop., vol. 29, No. 1, pp. 73-86, Jan. 1985.

"Comparison Study of Graphic thinning Processes" by H. Tamura, Information Processing Society of Japan 1-1(1975), pp. 1-12.

Davis et al, "Thinning Algorithms: A critque and a New Methodology", Pattern Recognition vol. 14, Nos. 1-6 pp. 53-63 (1981).

*Primary Examiner*—Leo Boudreau
*Assistant Examiner*—Monica S. Davis
*Attorney, Agent, or Firm*—Lowe, Price, LeBlanc & Becker

[57] ABSTRACT

A wiring pattern inspection apparatus for inspecting an abnormality of a wiring pattern formed on a printed circuit board, which is equipped with an optical image pickup device for optically illuminating a surface of the printed circuit board including the wiring pattern to photoelectrically convert optical information of the printed circuit board surface due to the optical illumination into a grey level image. This grey level image is converted into a bi-level image which separates the grey level image into the wiring pattern side and a background side of the wiring pattern. Thereafter, the bi-level image is once contracted by a first size and then expanded by a second size so as to eliminate a micro conductive portion left on the printed circuit board or a micro pinhole which can be disregarded in the abnormality inspection, thereby preventing the excessive detection.

1 Claim, 13 Drawing Sheets

| 0 | 0 | 0 |
|---|---|---|
| 1 | 1 | 0 |
| 0 | 0 | 0 |

| 0 | 0 | 0 |
|---|---|---|
| 0 | 1 | 0 |
| 0 | 1 | 0 |

| 0 | 0 | 0 |
|---|---|---|
| 0 | 1 | 0 |
| 1 | 0 | 0 |

| 0 | 0 | 0 |
|---|---|---|
| 0 | 1 | 0 |
| 0 | 0 | 1 |

LWT FOR 50

| 0 | 1 | 0 |
|---|---|---|
| 0 | 1 | 0 |
| 0 | 0 | 0 |

| 0 | 0 | 0 |
|---|---|---|
| 0 | 1 | 1 |
| 0 | 0 | 0 |

| 0 | 0 | 1 |
|---|---|---|
| 0 | 1 | 0 |
| 0 | 0 | 0 |

| 1 | 0 | 0 |
|---|---|---|
| 0 | 1 | 0 |
| 0 | 0 | 0 |

LWT FOR 50

| 0 | 0 | 0 |
|---|---|---|
| 0 | 1 | 0 |
| 0 | 0 | 0 | ns. 5,787,191

WIRING PATTERN INSPECTION APPARATUS FOR PRINTED CIRCUIT BOARD

This application is a division of application Ser. No. 08/219,759 filed Mar. 29, 1994, now U.S. Pat. No. 5,459,795, which is a continuation of application Ser. No. 07/829,199, filed Feb. 3, 1992, now abandoned.

BACKGROUND OF THE INVENTION

The present invention relates generally to wiring pattern inspection apparatus for printed circuit boards, and more particularly to such a wiring pattern inspection apparatus which detects defects of a wiring pattern on a printed circuit board on the basis of a bi-level image produced from an optical grey level image corresponding to the wiring pattern.

In response to the recent requirement for increasing the mounting density of electronic parts on a printed circuit board, improvement for fining a wiring pattern is being made increasingly. On the other hand, for the fining of the wiring pattern, it is required to accurately inspect the abnormality of the wiring pattern. However, difficulty is encountered to keep a high inspection accuracy by the conventional human-eye-based inspection systems and hence it is strongly desired to automatically effect the wiring pattern inspection. One known approach is a defect detecting system such as is disclosed in "Machine vision techniques for inspection of printed wiring boards and thick-film circuits", J. Opt. Amer., Vol. 3, no. 9, pp. 1465–1482, Sept. 1986, written by J. L. C. Sanz and A. K. Jain. The conventional wiring pattern inspection techniques are generally classified mainly into the so-called design-rule system and comparison system. One promising system of these conventional wiring pattern inspection techniques is arranged such that a defect of a wiring pattern is detected by contracting or expanding bi-level image data before the thinning process as disclosed in U.S. Pat. No. 4,853,967 and the document "Novel Method for analysis of printed circuit images" IBM J. Res. Develop., Vol. 29, no. 1, pp. 73–86, Jan. 1985, written by J. R. Mandeville. This system will briefly be described hereinbelow with reference to FIG. 1 in which (A) to (D) are for describing the procedure of the disconnection detecting process and (E) to (F) are for describing the procedure of the short detecting process. In (A) of FIG. 1 showing a defective image, character a represents a non-defective point, and b and c respectively denote fatally defective points accompanying the possibility of line-width abnormality or disconnection. As illustrated in (B) of FIG. 1, a contraction process (erosion process) of the FIG. 1(A) image is first effected so that a defect appears at the point b as disconnection, then followed by thinning the contracted image up to one pixel width as illustrated in FIG. 1(C). Finally, a decision process of the connectivity of the thinned image is effected by scanning 3×3 logical masks (indicated by square boxes) and referring to look-up tables as illustrated in FIG. 1(D), thereby detecting the disconnections of the points b and c.

FIG. 1(E) illustrates a defective image where points b and c similarly are fatally defective portions accompanying the possibility of the line-width abnormality or short and a point a designates a non-defective portion. As illustrated in (F) of FIG. 1, an expansion process is first effected by a predetermined size so as to generate a new connected state at the point b, then followed by the thinning process to thin the image up to one-pixel width as illustrated in (G) of FIG. 1, thereafter followed by the 3×3 logical scanning process to thereby decide the shorts at the points b and c.

There is a problem with arises with such a conventional wiring pattern inspection system, however, in that, in the case that a micro pinhole which can be disregarded in the inspection is on the wiring pattern, there is the possibility that the line-width abnormality (branching abnormality) of the wiring pattern is excessively detected due to the pinhole. In addition, if a micro conductive portion which can be disregarded in the inspection remains on the base section (the background of the wiring pattern) of the printed circuit board, there is also the possibility that the micro conductive portion is excessively detected as the line-width abnormality (disconnection abnormality).

SUMMARY OF THE INVENTION

It is therefore an object of the present invention to provide a wiring pattern inspection apparatus for printed circuit boards which is capable of accurately and selectively detecting abnormalities of a wiring pattern of a printed circuit board.

According to the present invention there is provided a wiring pattern inspection apparatus for inspecting an abnormality of a wiring pattern formed on a printed circuit board, said inspection apparatus comprising image inputting means for optically illuminating a surface of said printed circuit board including said wiring pattern to photoelectrically convert optical information of said printed circuit board surface due to the optical illumination into a grey level image. Also included in the apparatus is bi-level conversion means responsive to said grey level image from said image inputting means to convert said grey level image into a bi-level image in which the wiring pattern side and a background side of said wiring pattern are separated from each other. The apparatus contracts said bi-level image by a size corresponding to n pixels from the background side and then expands the contracted bi-level image by a size corresponding to m pixels so as to calculate a logical product of the expanded bi-level image and said bi-level image from said bi-level conversion means. The defect of the wiring pattern is detected on the basis of the calculation result of said removing means.

Preferably, before the defect detection, a logical-product bi-level image which is the calculation result is inverted and then contracted by a size corresponding to n' pixels and further expanded by a size corresponding to m' pixels so as to calculate a logical product of the expanded logical-product bi-level image and the inverted logical-product bi-level image, thereafter inverted again.

In addition, according to this invention, there is provided a wiring pattern inspection apparatus for inspecting an abnormality of a wiring pattern formed on a printed circuit board, said inspection apparatus comprising image inputting means for optically illuminating a surface of said printed circuit board including said wiring pattern to photoelectrically convert optical information of said printed circuit board surface due to the optical illumination into a grey level image and bi-level conversion means responsive to said grey level image from said image inputting means to convert said grey level image into a bi-level image in which the wiring pattern side and a background side of said wiring pattern are separated from each other. The apparatus thins a portion of said bi-level image corresponding to said wiring pattern by a size from the background side and further shortens the thinned bi-level image by a size so as to form an isolation point to form and output a contraction bi-level image. This isolation point of the contraction image is detected by detecting means.

Preferably, the apparatus further comprises first processing means coupled to said bi-level conversion means to first shrink said bi-level image from said bi-level conversion means by a predetermined size and then to expand the shrinked bi-level image by a predetermined size and second processing means coupled to said first processing means to further expand the expanded bi-level image due to said first processing means by a predetermined size so as to produce a mask image. The detection of the isolation point is effected in accordance with the mask image.

BRIEF DESCRIPTION OF THE DRAWINGS

The object and features of the present invention will become more readily apparent from the following detailed description of the preferred embodiments taken in conjunction with the accompanying drawings in which.

DETAILED DESCRIPTION OF THE INVENTION

Figure 1A:
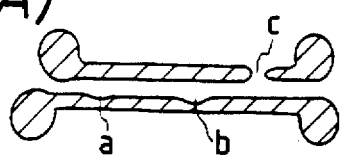
FIGS. 1(A)-1(H) show a wiring pattern inspection system according to a prior art technique.
Figure 1B:
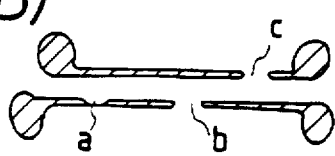
Figure 1C:
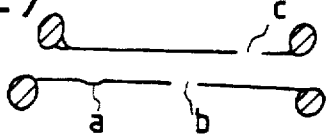
Figure 1D:
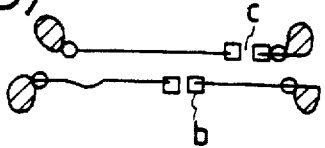
Figure 1E:
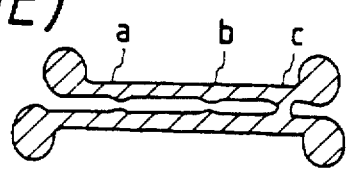
Figure 1F:
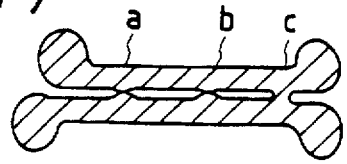
Figure 1G:
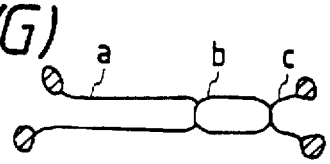
Figure 1H:
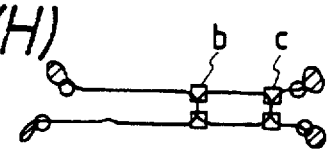
Figure 2:
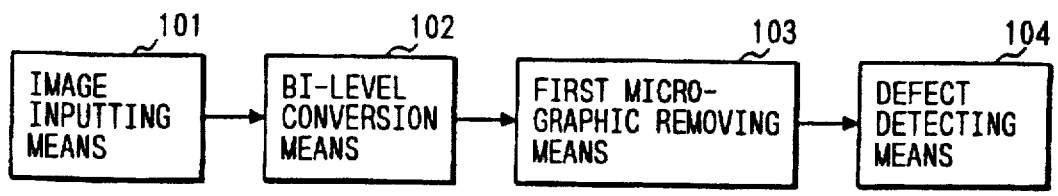
FIG. 2 is a block diagram showing an arrangement of a wiring pattern inspection apparatus according to a first embodiment of the present invention.

Referring now to FIG. 2, there is illustrated a block arrangement of a wiring pattern inspection apparatus according to a first embodiment of the present invention. In FIG. 2, designated at numeral 101 is an image inputting means comprising a diffusion illumination device such as a ring-like light guide and an image pickup device such as a CCD sensor camera, the image inputting means 101 inputs an image corresponding to a wiring pattern on a printed circuit board and outputs it as a grey level image to a bi-level conversion means 102. The bi-level conversion means 102 converts the inputed grey level image into a bi-level image (binary-codes the inputed grey level image). A first micro-graphic removing means 103 is responsive to the bi-level image from the bi-level conversion means 102 for contraction-processing the bi-level image by n pixels and further expansion-processing the contracted bi-level image by m pixels so as to compare the expanded bi-level image with the bi-level image from the bi-level conversion means 102. A defect detecting means 104 is coupled to the first micro-graphic removing means 103 for detecting a defect of the wiring pattern on the printed circuit board on the basis of the bi-level image outputted therefrom.

Secondly, a description will be made hereinbelow in terms of an operation of the wiring pattern inspection apparatus. The diffusion illumination device of the image inputting means 101 illuminates the wiring pattern on the printed circuit board and the image pickup device such as a one- or two-dimensional CCD sensor camera produces a grey level image on the basis of the reflection light from the wiring pattern surface of the printed circuit board. In the bi-level conversion means 102, the grey level image is compared with a predetermined threshold obtained in advance by a density histogram or the like to convert the grey level image into a bi-level image comprising "1" indicative of the wiring pattern portions and "0" representative of the base portions, thereby effecting the separation between the wiring pattern and the background in the grey level image. The first removing means 103 first performs a thinning process to repreatedly thin (contract) the bi-level image by one pixel predetermined times from the background side. Here, in this thinning process (contraction process), only the connectivity-keeping condition of the thinning conditions is ensured but the other conditions, i.e., the terminal-point-keeping condition and isolation-point-keeping condition, are disregarded. Here, the connectivity-keeping condition means that the wiring pattern is kept continuously so as not to be cut in the thinning process. The contracted image is again expanded by a predetermined size and the logical product (AND) of the expanded image and the original bi-level image from the bi-level conversion means 102 is then taken. The contraction process is for removing a micro conductive portion on the printed circuit board which is a portion undesirably left at the background side in forming the wiring pattern, whereby the micro conductive portion can disappear when again expanding the contracted image. In addition, the reproduction of the wiring pattern can accurately be effected due to the logical product process of the expanded image and the original bi-level image. Thus, it is possible to detect the defect of the wiring pattern by the defect detecting means 104 irrespective of the presence of the undesirable micro conductive portion on the printed circuit board.

Figure 3:
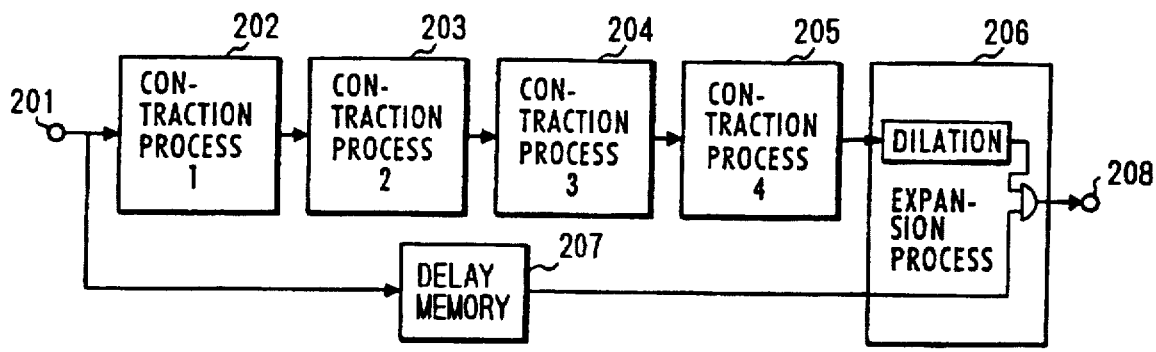
FIG. 3 is a block diagram showing an arrangement of the first micro-graphic removing means of the FIG. 2 wiring pattern inspection apparatus.
Figure 4:
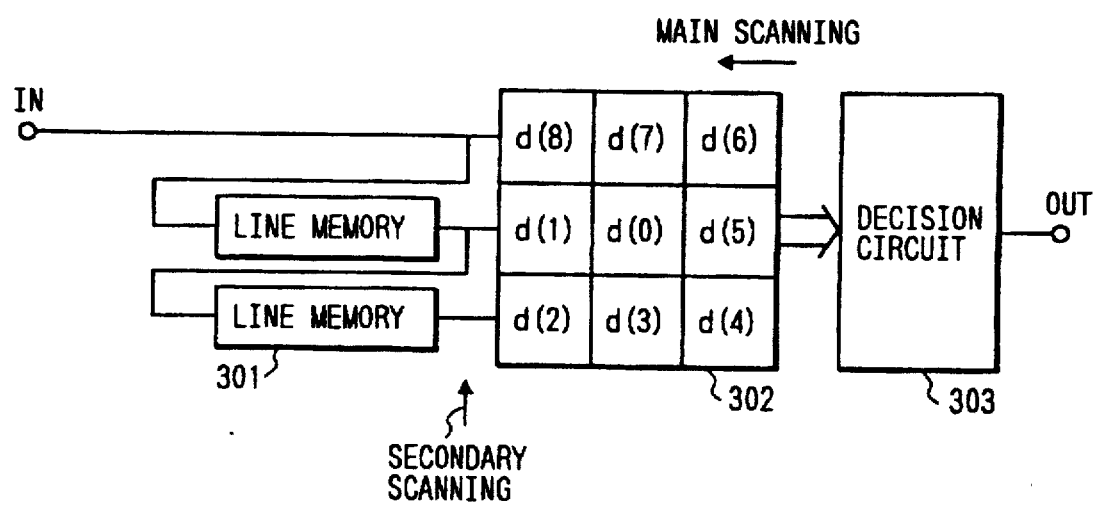
FIG. 4 shows an arrangement of a contraction processing circuit of the FIG. 3 first micro-graphic removing means.
Figure 5:
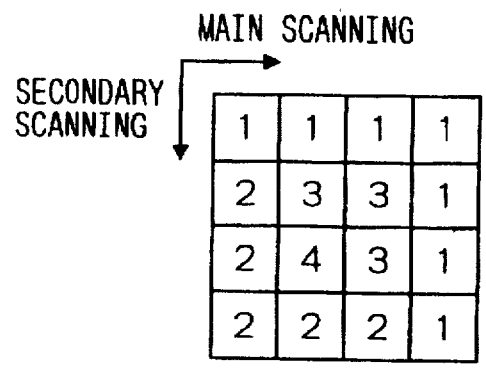
FIG. 5 illustrates the number of steps and directions of the contraction process to be performed in the FIG. 4 contraction processing circuit.

Further, the first removing means 103 will hereinbelow be described in detail with reference to FIGS. 3 to 7. Here, the description will be made in terms of the removal of a micro graphic comprising 1 to 4 pixels. FIG. 3 is a block diagram showing an arrangement of the first removing means 103 illustrated in FIG. 2. In FIG. 3, the bi-level image of the bi-level conversion means 102 is first inputted through an input terminal 201 to a first contraction processing circuit 202 and then successively supplied to second to fourth contraction processing circuits 203 to 205. The output of the fourth contraction processing circuit 205 is led to an expansion (restoration) processing circuit 206 so as to be expanded by a predetermined size and then AND-processed with respect to the bi-level image supplied through a delay memory 207 from the input terminal 201, the AND-processed result being outputted through an output terminal 208. FIG. 4 shows an arrangement of each of the contraction processing circuits 202 to 205. As shown in FIG. 4, each of the contraction processing circuits 202 to 205 is composed of line memories 301, a 3×3 scanning window 302 and decision circuit 303 so as to perform the two-dimensional mask process. Unlike the general thinning process, this contraction process is performed so as to satisfy only the connectivity-keeping condition. Thus, the terminal-point keeping condition and the isolation-point keeping condition are not ensured in this contraction process. FIG. 5 illustrates the number of steps and directions of the contraction process. In FIG. 5, "1" represents the pixels to be removed in the first step, "2" designates the pixels to be removed in the second step, and "3" and "4" are the pixels to be removed in the third and fourth steps. Further, the following table 1 shows the number n of pixels of the micro graphic to be removed, the number of steps in the contraction process and the number m of pixels in the expansion process, where the contraction process is effected only with respect to the portions indicated by x-marks.

TABLE 1

| | Contraction Step | | | | |
|---|---|---|---|---|---|
| n | #1 | #2 | #3 | #4 | m |
| 1 | x | | | | 1 |
| 2 | x | x | | | 1 |
| 3 | x | x | x | | 2 |
| 4 | x | x | x | x | 2 |

Here, the contraction processes in the odd steps #1 and #3 are different in condition from the even steps #2 and #4. In the case that the position relation of the scanning window is taken as indicated by 302 in FIG. 4, in the odd steps the target pixel is set to "0" when gxy in the following logical equation (1) is "1" or when the 3×3 scanning window 302 takes one of the patterns illustrated in FIG. 6A.

$$g \times y = d(0) \cdot \{d(1)+d(3)\} \cdot \{N4 = 1\} \cdot \qquad (1)$$
$$\{N8 = 1\} \cdot \left\{ \sum_{i \in S} d(i) > 1 \right\}$$

$$N4 = \sum_{i \in S} [d(i) - \{d(i) \cdot d(i+1) \cdot d(i+2)\}]$$

$$N8 = \sum_{i \in S} [d(i) - \{d(i) \cdot d(i+1) \cdot d(i+2)\}]$$

where S={1, 3, 5, 7} and d(7+2)=d(1).

Figure 6A:
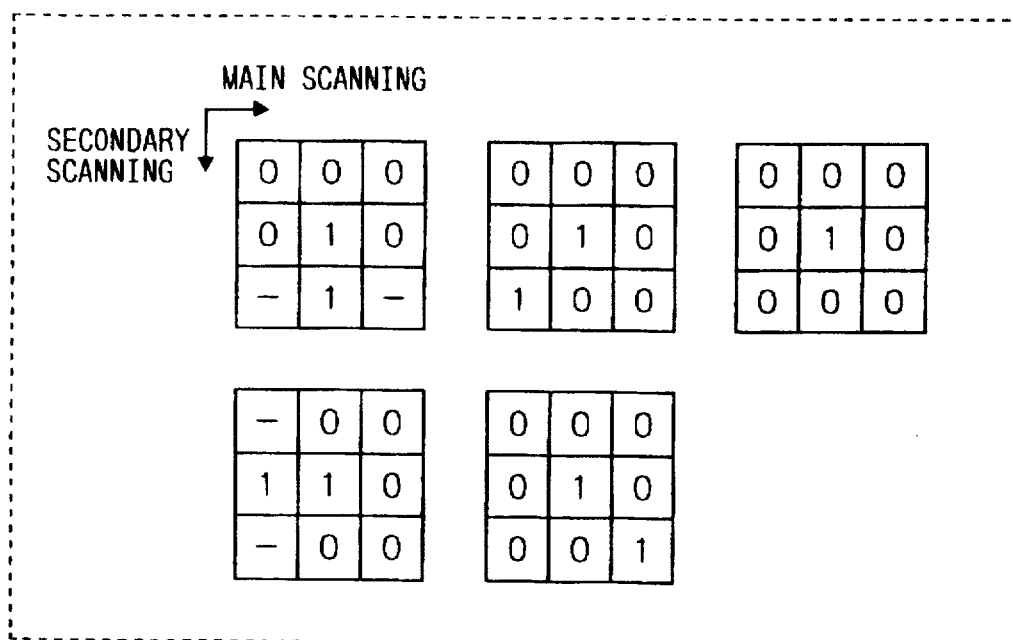
FIGS. 6A and 6B are illustrations of patterns of a 3×3 scanning window in the case that the target pixel is set to "0"

In the above equation (1), N4 represents the number of 4-adjacent patterns (edges) and N8 designates the number of 8-adjacent patterns, and in FIG. 6(A) the pixels indicated by marks "–" are either "0" or "1".

On the other hand, at the even steps the target pixels is set to "0" when gxy in the following logical equation (2) is "1" or when the 3×3 scanning window takes one of the patterns illustrated in FIG. 6B.

$$g \times y = d(0) \cdot \{d(5)+d(7)\} \cdot \{N4=1\} \cdot \{N8=1\} \cdot \left\{ \sum_{i \in S} d(i) > 1 \right\} \qquad (2)$$

Figure 6B:
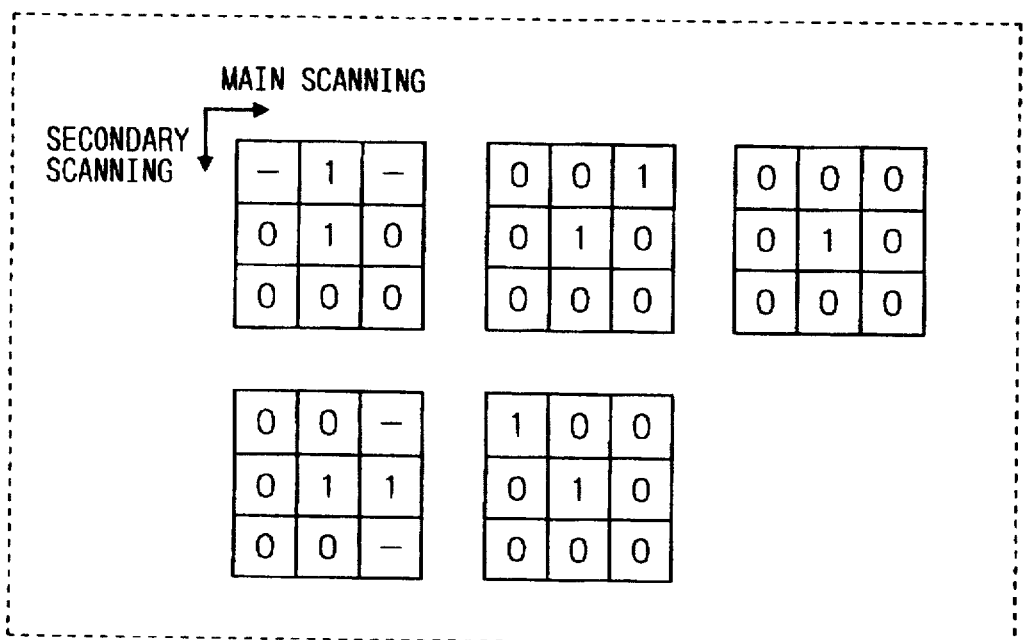

In the equation (2), N4 and N8 respectively designate the numbers of the 4-adjacent and 8-adjacent patterns, and in FIG. 6(B) the pixels indicated by marks "–" are either "0" or "1".

Figure 7:
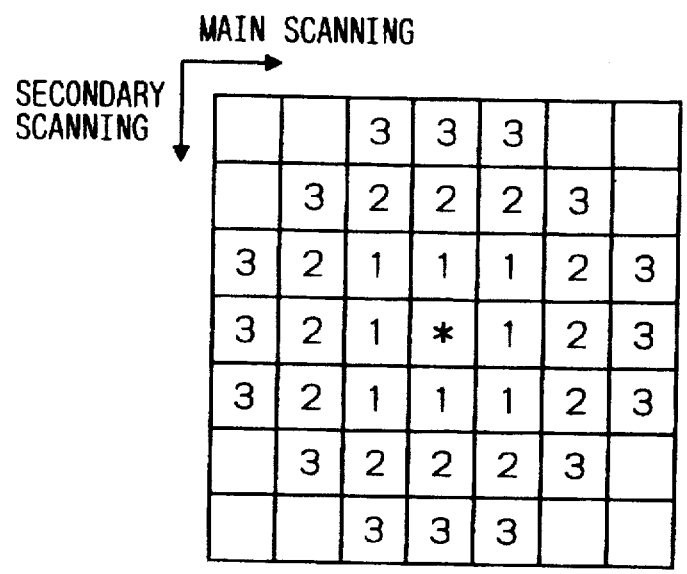
FIG. 7 is an illustration for describing the expansion process to be executed in the FIG. 2 wiring pattern inspection apparatus.

Secondly, a description will be made hereinbelow with reference to FIG. 7 in terms of the expansion process (206 in FIG. 3). FIG. 7 illustrates a 7×7 logical mask which is one example of logical masks. This logical mask is constructed with one or more line memories and one or more shift registers to perform a predetermined logical calculation with a window being shifted by one pixel in synchronism with a pixel clock signal. For example, in the case of performing the k-pixel expansion process, the logical sum of the pixels of the 7×7 scanning window whose values are below k is calculated. In addition, the logical product of the logical-sum result and the bi-level image from the bi-level conversion means 102 is calculated. Here, the number m of the expansion processes (the number of the pixels to be expanded) is switched in accordance with the number n of the pixels to be contracted as shown in the above table 1, and can be obtained in accordance with the following equation 3:

In the case that the pixel number n is an even number, $$m = \frac{n}{2} + 1$$

(where n is an even number);

$$m = \frac{n-1}{2} + 1$$

(where n is an odd number).

Figure 8:
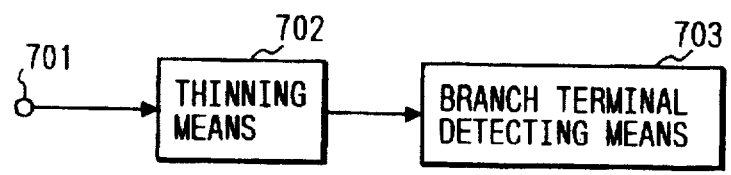
FIG. 8 is a block diagram showing an arrangement of the defect detecting means 104 of the FIG. 2 wiring pattern inspection apparatus.

A further description will be made hereinbelow with reference to FIG. 8 in terms of an arrangement of the defect detecting means 104. In FIG. 8, illustrated at numeral 702 is a thinning means for thinning the bi-level image, inputted through an input terminal 701 from the first removing means 103, by one pixel from the background side. The output image of the thinning means 702 is led to a branch-point and terminal-point detecting means 703, thereby detecting the branch points and terminal points of the wiring pattern.

Figure 9:
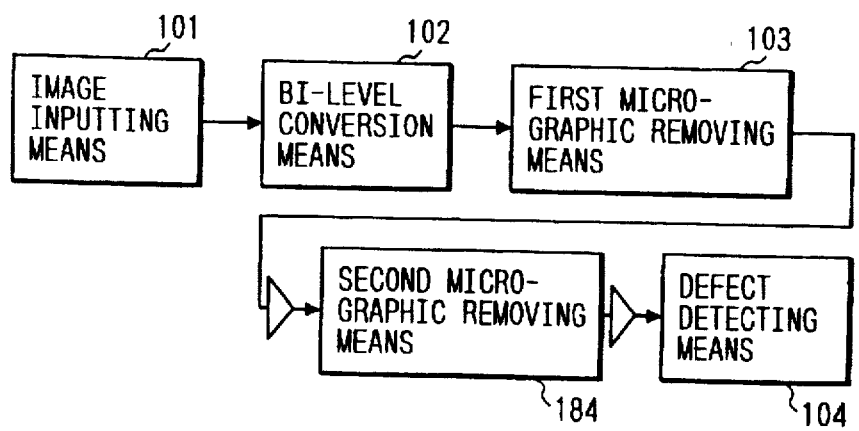
FIG. 9 is a block diagram showing an arrangement of a wiring pattern inspection apparatus according to a second embodiment of the present invention.

A description will further be made hereinbelow in terms of an arrangement of a wiring pattern inspection apparatus. FIG. 9 is a block diagram showing an arrangement of the second embodiment where parts corresponding to those in the first embodiment are marked with the same numerals. The difference between this second embodiment and the first embodiment is that a second micro-graphic removing means 184 is provided between the first micro-graphic removing means 103 and the defect detecting means 104. In FIG. 9, the second removing means 184 first inverts the bi-level image from the first removing means 103 and, like as the first removing means 103, contracts it designated times under only the connectivity-keeping condition and expands the contracted image by a predetermined size to calculate the logical product of the expanded image and the bi-level image from the bi-level conversion means 102, and thereafter again inverts and outputs the calculation result. The basic arrangement of the second removing means 184 is substantially the same as the first removing means 103 and, hence the description thereof will be omitted for brevity. If a microscopic pinhole exists on the wiring pattern, the second removing means 184 allows the stopgap (removal) of the microscopic pinhole which can be disregarded in the inspection, thereby adequately detecting the abnormality of the wiring pattern without excessive detection.

Figure 10A:
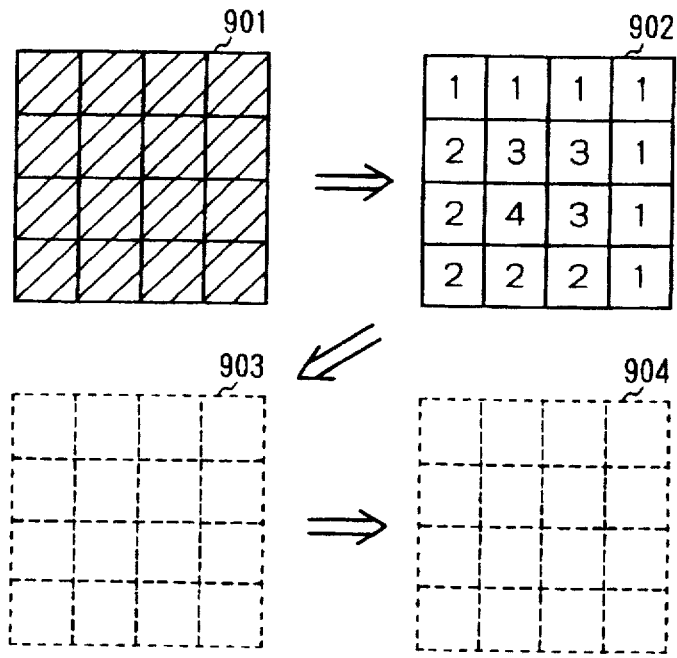
FIGS. 10A and 10B are illustrations for describing the processes to be executed in this invention.
Figure 10B:
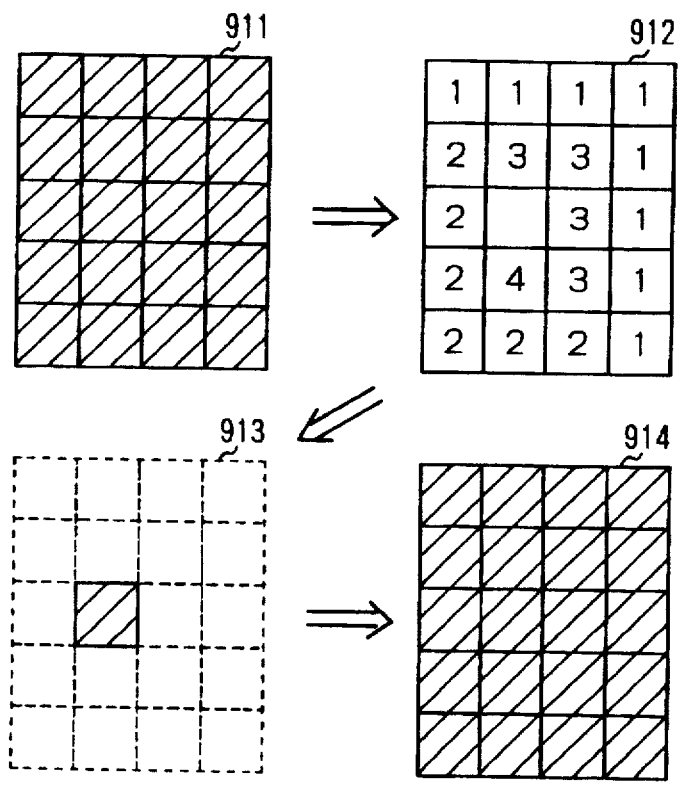

Furthermore, a description will be made hereinbelow with reference to FIGS. 10A and 10B in terms of the processes to be executed in this invention. FIG. 10A shows one example of the process for a 4×4 pattern 901 and FIG. 10B illustrates one example of the process for a 4×5 pattern 911. For removing a micro graphic whose pixel number is below 4, the 4-step contraction processes are performed as illustrated at 902 and 912, whereby the patterns 901 and 911 respectively become as indicated by 903 and 913.

That is, in the case of the 4×4 pattern, all the pixels completely disappears, while in the case of the 4×5 pattern, one pixel still remains without disappearing. Here, if performing the 3-pixel expansion process with respect to the contracted image and then calculating the logical product of the expanded image and the original pattern, the 4×4 pattern is not restored as illustrated by 904 because the pattern completely disappear by the contraction process, while the 3×5 pattern can accurately be restored to the original pattern due to the remaining one pixel as illustrated by 914.

Figure 11:
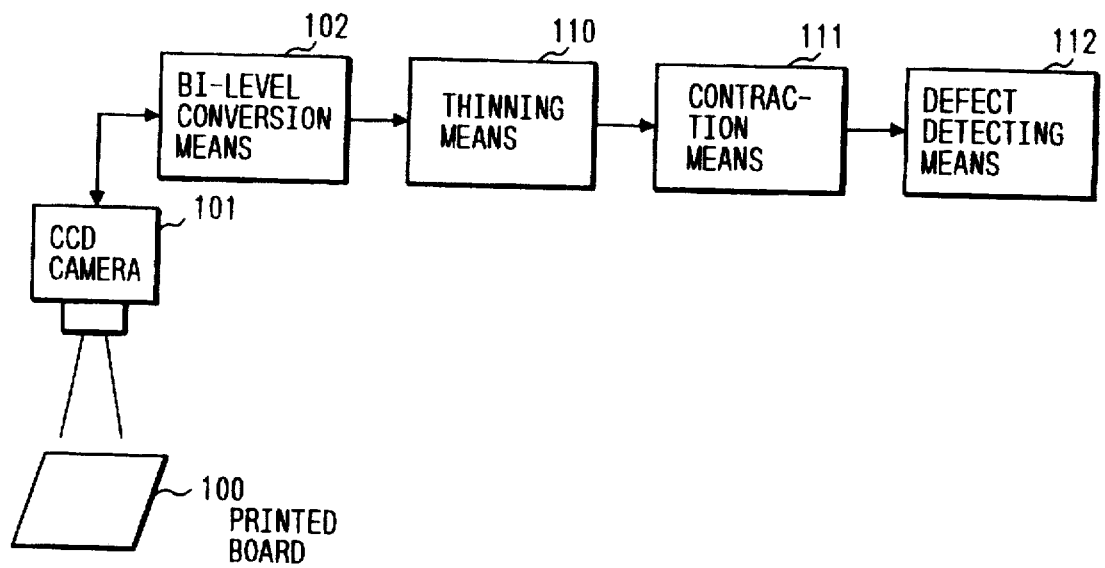
FIG. 11 is a block diagram showing an arrangement of a wiring pattern inspection apparatus according to a third embodiment of this invention.

Further, a description will be made hereinbelow in terms of a third embodiment of this invention. FIG. 11 is a block diagram showing an arrangement of a wiring pattern inspection apparatus according to this third embodiment where parts corresponding to those in FIG. 2 are marked with the same numberls. In FIG. 11, an image inputting means 101, which is composed of an image pickup device such as a CCD line sensor camera and an illumination device such as an ultra-high luminance LED, optically illuminates a printed circuit board 100 so as to output a grey level image corresponding to the printed circuit board 100. The illumination device is preferable to be arranged to emit light with a wavelength of about 600 nm. The grey level image from the image inputting means 101 is supplied to a bi-level conversion means 102 which in turn converts the grey level image into a bi-level image by comparing the grey level image with a predetermined threshold level. Here, for the bi-level conversion, in the case of detecting the undesirably left conductive portion, the wiring pattern side of the printed circuit board 100 is set to "1" and the base side (a portion other than the wiring pattern) thereof is set to "0". On the other hand, when detecting the pinhole, the wiring pattern side is set to "0" and the base side is set to "1". The bi-level image from the bi-level conversion means 102 is supplied to a thinning means 110 for thinning the bi-level image by given pixels (i. e., the number of pixels corresponding to the pinhole or conductive portion to be detected as an isolation point). After the thinning process, a contraction means 111 contracts (shortens) only a relatively short core line of the lines obtained in the thinning process so as to form an isolation point. A defect detecting means 112 then detects a defect of the isolation point obtained in the contraction process.

Figure 12:
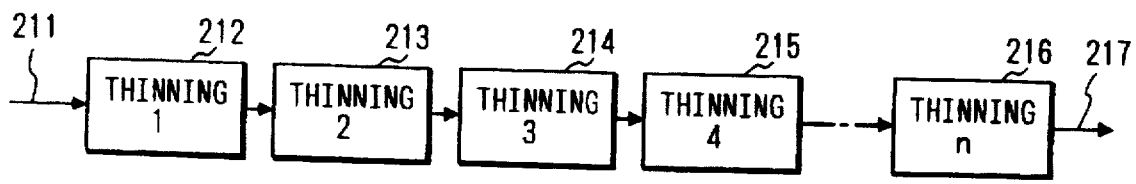
FIG. 12 is a block diagram showing an arrangement of a thinning means of the FIG. 11 wiring pattern inspection apparatus.
Figure 13:
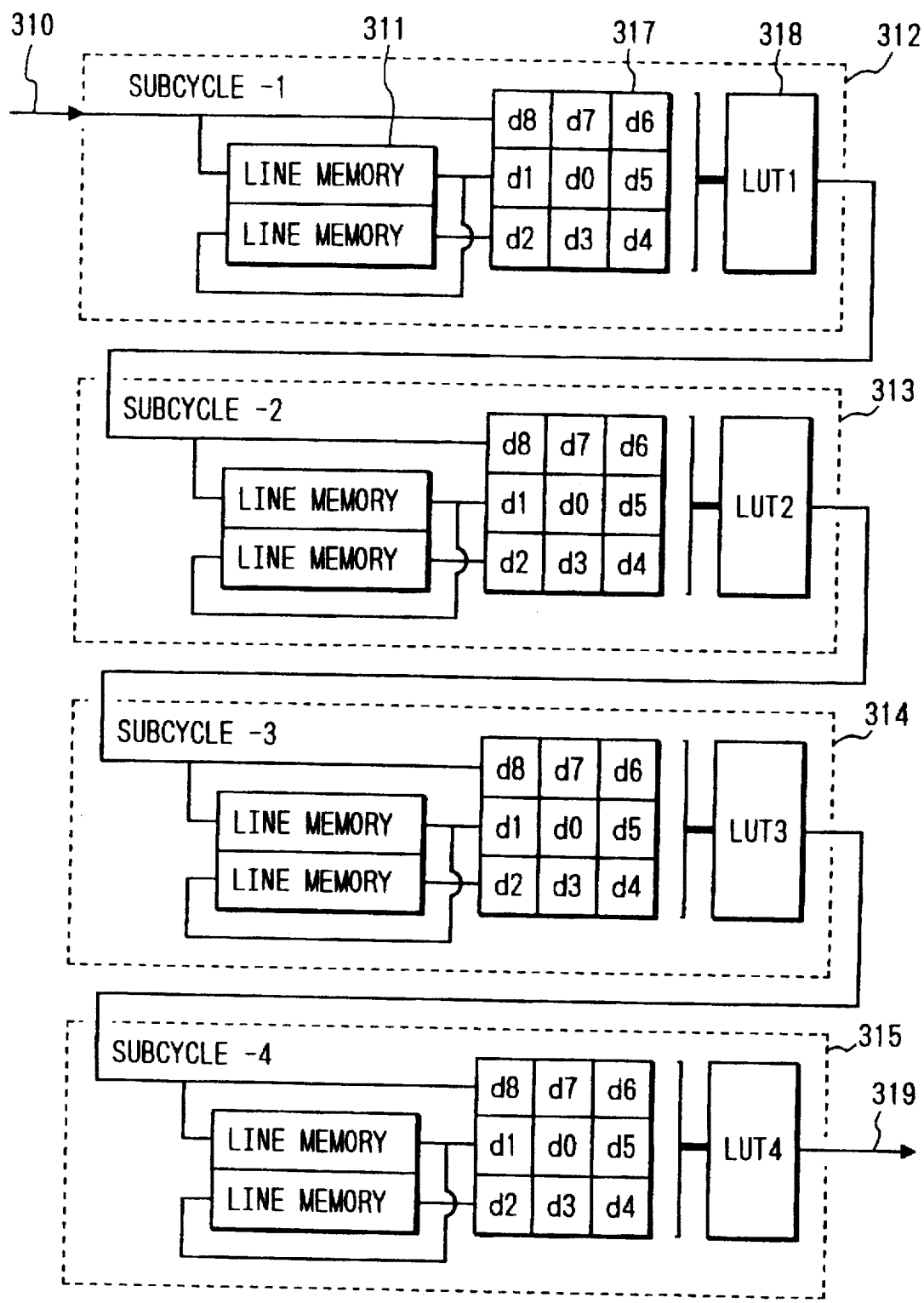
FIG. 13 is an illustration for describing a thinning process.

The thinning process will hereinbelow be described in detail with reference to FIGS. 12 and 13. FIG. 12 is a block diagram showing an arrangement of the thinning means 110. Generally, the thinning process is effected by a frame memory for one image surface so as to successively thin the wiring pattern by one pixel plural times from the background side or repeatedly thin the wiring pattern until the width of the writing pattern becomes equal to the width of one pixel. However, because this method takes a long time, the thinning unit for one pixel is constructed with a hardware. Thus, as illustrated in FIG. 12, in the thinning means 110 there are provided one-pixel thinning units 212 to 216 which perform the n-step pipeline process with respect to the bi-level image 211 inputted from the bi-level conversion means 102, thereby obtaining a thinned image 217 with the real time. A brief description will be made hereinbelow in terms of the thinning unit for processing one pixel.

The thinning process is generally known as exemplified in "Comparison Study of Graphic Thinning Processes" Information Processing Society of Japan, 1-1 (1975), written by Tamura. FIG. 13 shows one example of the thinning processing techniques. In FIG. 13, the bi-level image 0.310 inputted is successively mask-processed by 4 subcycles 312 to 315, each comprising line memories 311, a 3×3 scanning window 317 and a look-up table (LUT) 318, and then outputted as a thinned image 319. The respective subcycles 312 to 315 are similar in arrangement to each other except for the contents of the LUT 318.

Figure 14:
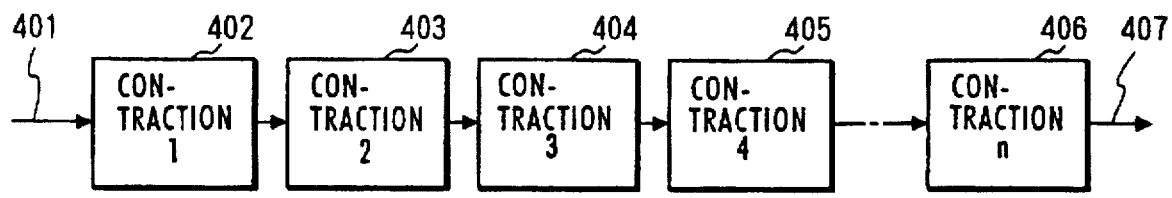
FIGS. 14 and 15 are illustrations for describing a contraction process in the FIG. 11 wiring pattern inspection apparatus.
Figure 15:
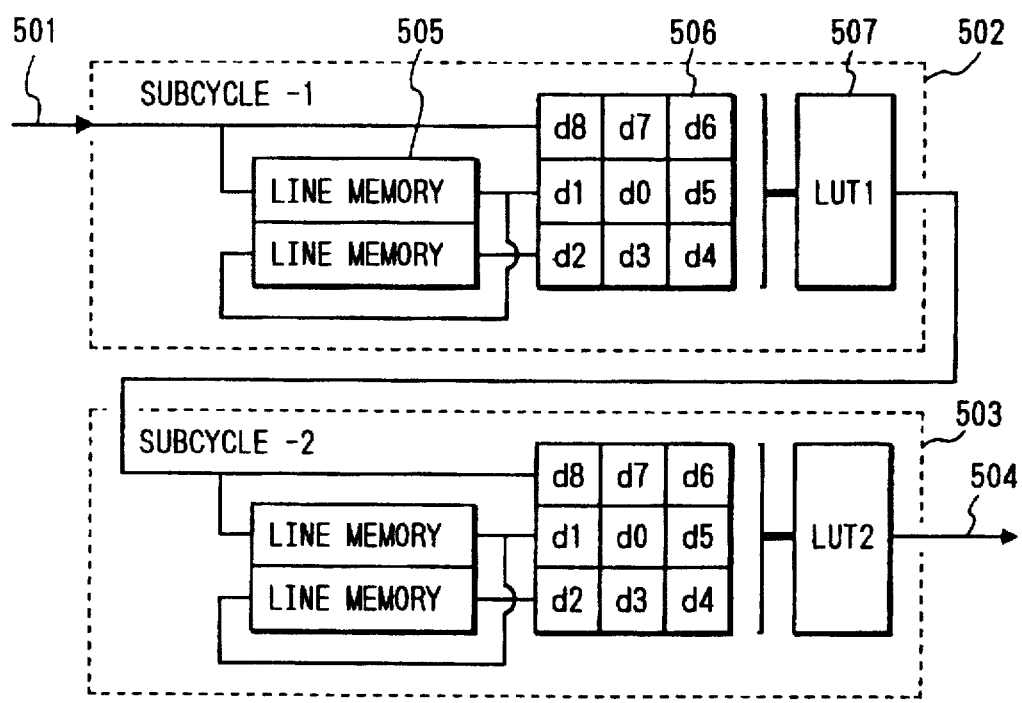
Figures 16A, 16B, 16C:
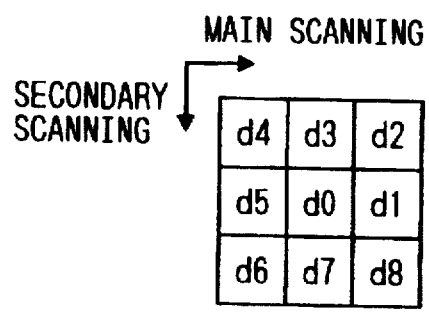
FIGS. 16A to 16C are illustrations of contraction patterns in the contraction process to be executed by the FIG. 11 wiring pattern inspection apparatus.

Secondly, the contraction means 111 will be described hereinbelow with reference to FIGS. 14 and 15. The contraction process is for contracting the wiring pattern by one pixel plural times or repeatedly contracting the wiring pattern until an isolation point (a point indicated by one pixel) appears. As well as the thinning means 110, the contraction unit for performing the one-pixel contraction process is constructed with a hardware, and n contraction units are couped so as to perform the n-step pipeline process to thereby realize the real time process. In the contraction process, it is possible to process the core line corresponding to the maximum (2n+1) pixels to the isolation point. In FIG. 14, illustrated at numerals 402 to 406 are contraction units each of which contracts (removes) the inputted thinned image 401 by one pixel and which allows the n-step pipeline process whereby contracted image can be obtained with the real time. In FIG. 15, the inputted thinned image 501 is successively mask-processed by two subcycles 502 and 503 each of which is composed of line memories 505, a 3×3 scanning window 506 and a look-up table (507). Both the subcycles 502 and 503 have the same arrangement except for the centents of the LUT 507. The contraction decision is made in accordance with the LUT 507. FIGS. 16A to 16C are illustrations of patterns for the contraction process.

Figures 17A, 17B:
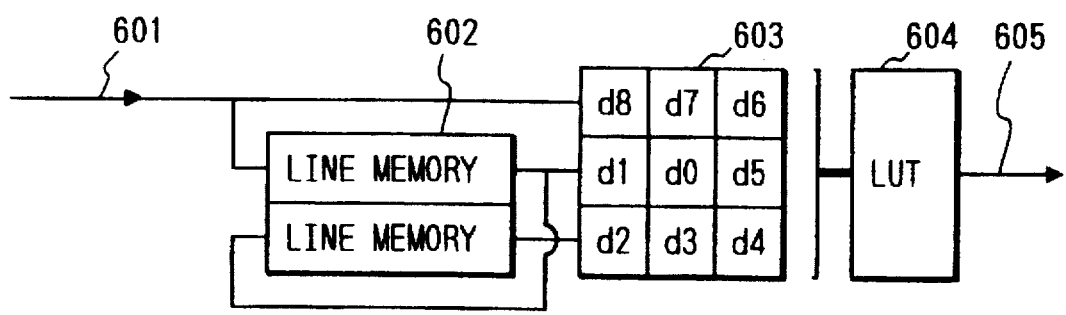
FIG. 17A is a block diagram showing an arrangement of the defect detecting means of the FIG. 11 wiring pattern inspection apparatus.
FIG. 17B is an illustration of an isolation-point detection pattern.

Further, the defect detecting means 112 will be described hereinbelow with reference to FIGS. 17A and 17B. FIG. 17A is a block diagram showing an arrangement of the defect detecting means 112. As illustrated in FIG. 17A, the defect detecting means 112 is responsive to the contracted image 601 from the contraction means 111 and composed of line memories 602, a 3×3 scanning window 603 and a LUT 604. The defect detecting means 112 performs the mask-process so as to detect an isolation point and output the detection signal (an isolation point signal) 604. In the LUT 605 there is stored an isolation point detecting table. The detection pattern is formed as illustrated in FIG. 17B.

Although this embodiment has been described only in terms of the isolation point, it is possible to simultaneously detect a brached point and a terminal point by the 3×3 mask process of the thinned image to further inspect the short and disconnection of the wiring pattern. In addition, although the present embodiment has been described in terms of the wiring pattern side, if the same process is effected with respect to the image obtained by inverting the bi-level image, it is possible to detect as the left conductive portion the wiring pattern side isolation point and detect as the pinhole the isolation point of the inverted image.

Figure 18A:
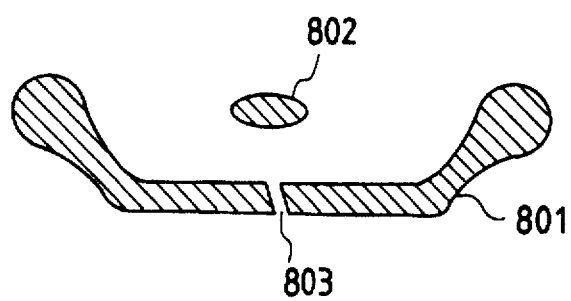
FIGS. 18A to 18C are illustrations for describing one example of the process to be executed in the third embodiment.
Figure 18B:
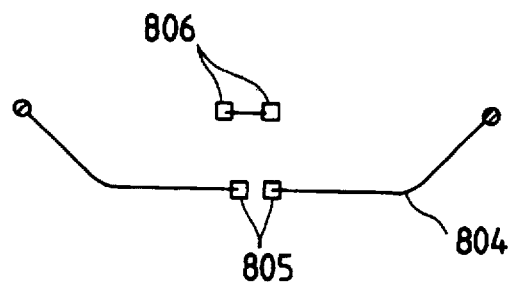
Figure 18C:
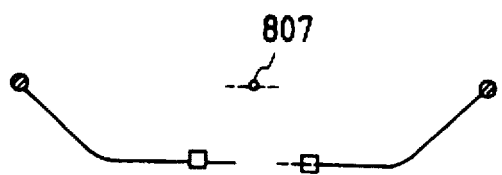

FIGS. 18A to 18C are illustrations for describing one example of the process to be executed in this embodiment. FIG. 18A illustrates a bi-level image including a conductive portion 802 in the base and a disconnecting portion 803 in a wiring pattern 801 and FIG. 18B shows a core line image 804 with one-pixel width due to the thinning process. Here, the terminal points 805 due to the disconnection and the terminal points 806 due to the left conductive portion are detectable by this thinned image. FIG. 18C shows an isolation point 807 formed by contracting the core line of the left conductive portion 802 in the contraction process.

Figure 19A:
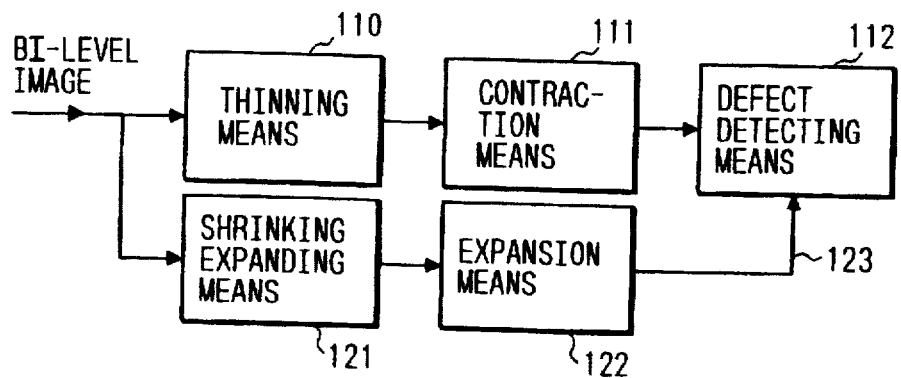
FIG. 19A is a block diagram showing an arrangement of a wiring patern inspection apparatus according to a fourth embodiment of this invention.

Moreover, a description will be made hereinbelow in terms of a wiring pattern inspection apparatus according to a fourth embodiment of this invention. FIG. 19A shows an arrangement of the fourth embodiment where parts corresponding to those in FIG. 11 are marked with the same numerals. In FIG. 19A, designated at numeral 110 is a thinning means responsive to the bi-level image from the bi-level conversion means 102 to thin the bi-level image by one pixel from the background side and denoted at numeral 111 is a contraction means responsive to the core line image, which is the output image of the thinning means 110, for contracting it.

Further, the bi-level image is also inputted to a shrinking and expanding means 121 for shrinking and expanding the bi-level image to remove the left conductive portion (or the pinhole), the output image of the shrinking and expanding means 121 being supplied to an expansion means 122. The expansion means 122 expands the bi-level image from the shrinking and expanding means 121 by given pixels to output a mask image 123. Illustrated at numeral 112 is a defect detecting means responsive to both the output image of the contraction means 111 and output of the expansion means 122. The defect detecting means 112 detects an isolation point on the basis of the output of the contraction means 111 and detects only a left conductive portion near the wiring pattern (or only a pinhole near the background of the wiring pattern) from the mask image 123.

In operation, the thinning means 110 repeatedly thins the bi-level image from the bi-level conversion means 102 by one pixel from the background and the contraction means 111 contracts the thinned bi-level image by one pixel. In addition, the bi-level image from the bi-level conversion means 102 is also supplied to the shrinking and expanding means 121 which removes the left conductive portion (or the pinhole) by shrinkage and expansion and then outputs the conductive-portion-removed image to the expansion means 122. The expansion means 122 produces the mask image 123 by performing the expansion by set pixels corresponding to the distance from the wiring pattern. The defect detecting means 112 inputs the contracted image from the contraction means 111 and the mask image from the expansion means 122 so as to detect only the left conductive portion near the wiring pattern (or only the pinhole near the background of the wiring pattern). That is, the defect detecting means 112 is arranged so as not to detect the conductive portion away from the wiring pattern because it does not affect the electrical performance.

The description of the shrinking process and the expanding process will be omitted for brevity because they are well known as prior art graphic-processing techniques.

Figure 19B:
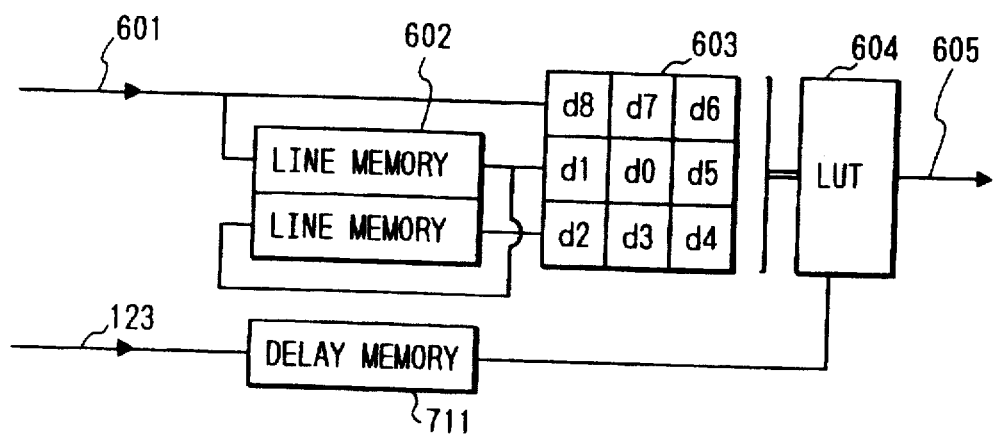
FIG. 19B is a block diagram showing an arrangement of a defect detecting means of the FIG. 19A wiring pattern inspection apparatus.
Figure 19C:
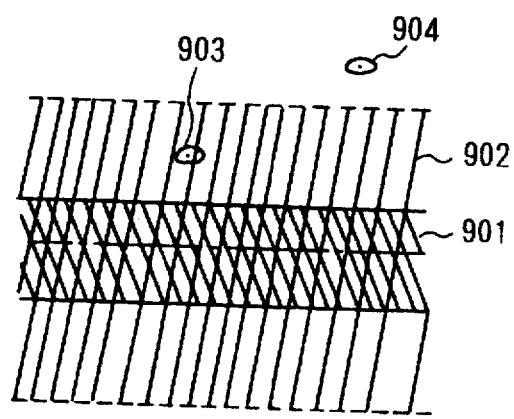
FIG. 19C is an illustration for describing the process to be executed in the fourth embodiment.

FIG. 19B is a block diagram showing an arrangement of the defect detecting means 112 which is basically similar to that of FIG. 17A, where parts corresponding to those in FIG. 17A are marked with the same numerals. The defect detecting means 112 is arranged to to control the LUT 604 in accordance with the mask image 123 so as to output a signal 605 indicative of the isoltion point within the mask region only. A delay memory 711 is for the timing adjustment. FIG. 19C is an illustration of the process to be executed in the fourth embodiment apparatus. In FIG. 19C, numeral 901 represents the wiring pattern, 902 denotes the mask image obtained by expanding the wiring pattern, and 903, 904 depict left conductive portions. As seen from this illustration, only the conductive portion near the wiring pattern 901 is detected.

Figure 20A:
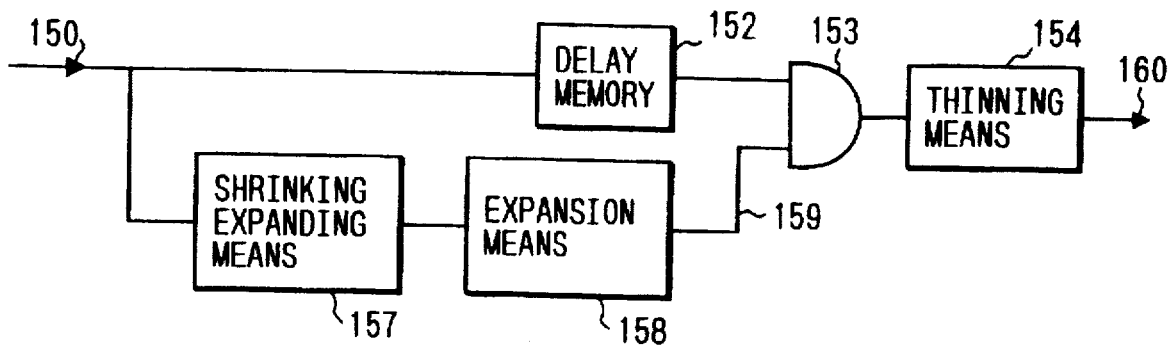
FIG. 20A is a block diagram showing a wiring pattern inspection apparatus according to a fifth embodiment of this invention.
Figure 20B:
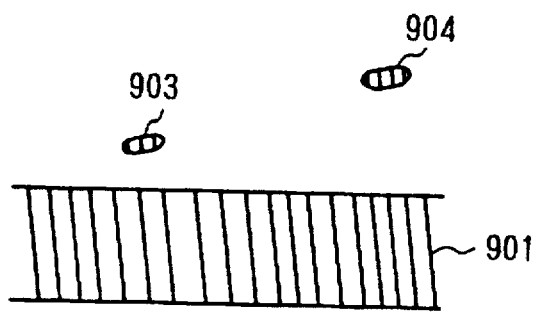
FIGS. 20B and 20C are illustrations for describing the process to be effected in the FIG. 20A wiring pattern inspection apparatus.
Figure 20C:
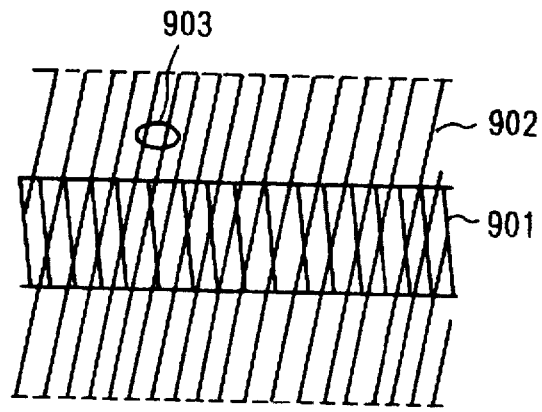

Still further, a description will be made hereinbelow in terms of a fifth embodiment of this invention. FIG. 20A is a block diagram showing an arrangement of a wiring pattern inspection apparatus of the fifth embodiment. In FIG. 20A, the bi-level image from the bi-level conversion means 102 is supplied through a timing-adjusting delay memory 152 to a logical product circuit 153 and further supplied through a shrinking and expending means 157 and an expansion means 158 to the logical product circuit 153. The shrinking and expending means 157 is for removing the left conductive portion (or the pinhole) and the expansion means 158 is for expanding the output of the shrinking and expanding means 157 by given pixels so as to produce a mask image 159. The output of the logical product circuit 153 is led to a thinning means 154 to produce a thinned image 160.

In operation, the shrinking and expanding means 157 removes the left conductive portion (or the pinhole) by shrinkage and expansion processes, and the expansion means 158 expands the output of the shrinking and expanding means 157 by given pixels so as to produce a mask image 159. Further, the logical product circuit 153 calculates the logical product of the bi-level image 150 and the mask image from the expansion means 158 to supply the logical product result, i.e., the image within the mask region only, to the thinning means 154. The output image of the thinning means 154 is supplied to the contraction means 111 and further to the defect detecting means 112 (see FIG. 11).

According to the present invention, the bi-level-converted wiring pattern is repeatedly thinned by one pixel in the thinning process and then contracted successively by one pixel in the contraction process so as to form an isolation point. In the case that the wiring pattern side is set to "1", the isolation point is detected as the left conductive portion, and in the case that the base side is set to "1", the isolation point is detected as the pinhole. That is, the detection can be made with the defect being separated from the other defects such as a terminal point due to a disconnection.

Further, according to this invention, the bi-level image is shrinked and expanded in order to remove the left conductive portion or the pinhole, and further expanded so as to produce a mask image to detect the defect near the wiring pattern only. Thus, this arrangement is made so as not to detect the defect (left conductive portion) away from the wiring pattern.

Still further, according to this invention, the bi-level image is shrinked and expanded and further expanded by given pixels so as to produce a mask image and the logical product of the finally expanded image and the orignal bi-level image is taken, whereby the defect detection is effected in terms of the bi-level image in which the conductive portion (or the pinhole) which is out of the mask region is eliminated, thereby preventing the excessive defect detection.

It should be understood that the foregoing relates to only preferred embodiments of the present invention, and that it is intended to cover all changes and modifications of the embodiments of the invention herein used for the purposes of the disclosure, which do not constitute departures from the spirit and scope of the invention.

What is claimed is:

1. A wiring pattern inspection apparatus for inspecting an abnormality of wiring pattern formed on a printed circuit board, comprising:

image inputting means for optically illuminating a surface of said printed circuit board including said wiring pattern and for photoelectrically converting optical information of said printed circuit board surface due to the optical illumination into a grey level image;

bi-level conversion means responsive to said grey level image from said image inputting means to convert said grey level image into a bi-level image in which the wiring pattern side and a background side of said wiring pattern are separated from each other;

first removing means coupled to said bi-level conversion means to contract said bi-level image by a size corresponding to n pixels from the background side and then to expand the contracted bi-level image by a size corresponding to m pixels, wherein said first removing means includes a first AND-processing means to calculate a logical product of the expanded bi-level image and said bi-level image from said bi-level conversion means;

second removing means coupled to said first removing means to invert the logical-product bi-level image which is the calculation result of said first removing means and then to contract the inverted logical-product bi-level image by a size corresponding to n' pixels and further, to expand the contracted inverted logical-product bi-level image by a size corresponding to m' pixels, wherein said second removing means includes, a second AND-processing means to calculate a logical-product of the expanded inverted logical-product bi-level image and the inverted logical-product bi-level image, and an inverter means to again invert the calculation result of said second AND-processing means; and defect detecting means coupled to said second removing means to detect a defect of said wiring pattern on the basis of the inverted calculation result of said inverter means.

* * * * *